(12) United States Patent
Mardi et al.

(10) Patent No.: US 6,891,384 B2
(45) Date of Patent: May 10, 2005

(54) MULTI-SOCKET BOARD FOR OPEN/SHORT TESTER

(75) Inventors: Mohsen Hossein Mardi, San Jose, CA (US); Joseph Macabante Juane, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/180,860

(22) Filed: Jun. 25, 2002

(65) Prior Publication Data

US 2004/0017216 A1 Jan. 29, 2004

(51) Int. Cl.$^7$ .............................................. G01R 31/02
(52) U.S. Cl. ..................... 324/754; 324/765; 324/158.1
(58) Field of Search .................... 324/754, 75, 758, 324/761, 765, 762, 158.1; 439/66, 70, 71; 901/10; 438/14–18

(56) References Cited

U.S. PATENT DOCUMENTS

| | | | | |
|---|---|---|---|---|
| 4,924,179 A | * | 5/1990 | Sherman | 324/755 |
| 5,477,160 A | * | 12/1995 | Love | 324/755 |
| 5,764,071 A | * | 6/1998 | Chan et al. | 324/754 |
| 5,907,245 A | * | 5/1999 | Fredrickson | 324/754 |
| 5,945,837 A | * | 8/1999 | Fredrickson | 324/761 |
| 5,955,888 A | | 9/1999 | Frederickson et al. | |
| 6,181,146 B1 | * | 1/2001 | Koyama | 324/755 |
| 6,292,003 B1 | | 9/2001 | Fredrickson et al. | |
| 2002/0027445 A1 | | 3/2002 | Sausen | |

FOREIGN PATENT DOCUMENTS

JP        01 059081 A        3/1989

OTHER PUBLICATIONS

U.S. Appl. No. 09/849,815, Mardi et al.

* cited by examiner

*Primary Examiner*—David Zarneke
*Assistant Examiner*—Jimmy Nguyen
(74) *Attorney, Agent, or Firm*—William L. Paradice, III; Edel M. Young; Justin Liu

(57) ABSTRACT

An interface structure includes first and second portions. The first portion has physical dimensions that are compatible with the docking area of an associated device tester, and includes a first socket configured to receive a first BGA package. The second portion, which is adjacent to and contiguous with the first portion, extends laterally beyond the docking area of the device tester to provide additional testing area that may include one or more additional sockets. In one embodiment, the second portion includes a second socket configured to receive a second BGA package, wherein the second size and configuration of second BGA package are different from the size and configuration of the first BGA package.

12 Claims, 7 Drawing Sheets

MULTI-SOCKET BOARD FOR OPEN/SHORT TESTER

FIELD OF INVENTION

This invention relates generally to integrated circuit testing, and more specifically to an interface structure for routing test signals between ball grid array packaged integrated circuits and integrated circuit device testers.

BACKGROUND

Integrated circuit (IC) devices typically include an IC chip housed in a package formed of plastic, ceramic or metal. The IC chip includes an integrated circuit formed on a thin piece (e.g., "chip") of silicon. The package supports and protects the IC chip and provides electrical connections between the integrated circuit and an external circuit or system.

There are several package types, including ball grid arrays (BGAs), pin grid arrays (PGAs), plastic leaded chip carriers, and plastic quad flat packs. Each of the package types is typically available in numerous sizes and configurations. The package type and configuration selected by an IC manufacturer for a particular IC chip may be determined by the size and complexity of the IC chip and/or in accordance with a customer's requirements.

For example, BGA packages may include any suitable number of solder balls to provide electrical connections between the IC chip and an external circuit or system. The solder balls may be formed over all or a portion of a bottom surface of the package. For example, BGA packages that include solder balls formed over the entire package bottom are said to have a full footprint, while BGA packages that include solder balls formed around the periphery of the package bottom are said to have a peripheral footprint. In addition, the pitch, which may be defined as the lateral distance between the solder balls, may vary between BGA packages.

FIGS. 1A and 1B show bottom and side sectional views, respectively, of a typical BGA package 100 having a full footprint. BGA package 100 includes a plurality of solder balls 102 formed on a bottom surface 104a of a substrate 104. Balls 102 are arranged in a matrix spanning the length L and width W of substrate bottom surface 104a. An IC chip 106 is mounted on an upper surface 104b of package substrate 104. Bond wires 108 provide electrical connections between bonding pads 110 of IC chip 106 and contact pads 112 formed on substrate 104. Contact pads 112 are electrically connected to corresponding balls 102 by conductive vias 114 formed in substrate 104. A protective cover 116, such as a cap or "glob top", is formed over IC chip 106 and bond wires 108.

FIGS. 2A and 2B show bottom and side sectional views, respectively, of a typical BGA package 200 having a peripheral footprint. Like BGA package 100 (FIGS. 1A and 1B), BGA package 200 includes a plurality of solder balls 202 formed on a bottom surface 204a of substrate 204 and connected to IC chip 206 by bond wires 208 and conductive vias 214. However, unlike BGA package 100, balls 202 of BGA package 200 are arranged around the periphery of substrate bottom surface 204a, thereby leaving a central area of substrate bottom surface 204a without balls 202.

IC manufacturers typically test their IC packages before shipping to customers using well-known IC testing systems. A typical IC testing system includes a device tester, a device handler, and an interface structure. The device tester includes a plurality of test probes that provide test signals to the interface structure, which in turn transmits signals between the device tester and the leads (e.g., solder balls) of an IC device under test (DUT). The device handler is a precise robot that automatically moves IC devices between a storage area and the interface structure.

FIG. 3 shows a top view of a conventional interface structure 300 that may be used to test BGA package 100 of FIGS. 1A and 1B. Interface structure 300 includes a rectangular-shaped printed circuit board (PCB) 302 having a socket 304 located in a central test area. PCB 302 is of a size and shape that allows it to be received into a docking area of an associated device tester (not shown). Socket 304 includes a plurality of compressible pins such as pogo pins 306 arranged in a matrix so as to mate with and contact corresponding balls 102 of BGA package 100 (not shown in FIG. 3). Thus, the arrangement of pogo pins 306 of socket 304 corresponds to the arrangement of balls 102 of BGA package 100. PCB 302 includes groups 308 of conductive contacts 310 positioned around the periphery of socket 304. Contacts 310 extend through a bottom surface of PCB 302 to receive corresponding test probes (not shown) extending from the device tester, and are connected to corresponding pogo pins 306 of socket 304 by conductive lines (e.g., metal traces) 312. For simplicity, only a few conductive traces 312 are shown in FIG. 3.

The arrangement of contact groups 308 shown in FIG. 3 is compatible with the Model TR-8 MDA tester from Checksum, Inc. of Arlington, Wash. For simplicity, each group 308 is shown to include 4 contacts 310, although groups 308 may include any suitable number of contacts 310. For example, for compatibility with the Model TR-8 MDA Tester, each group 308 includes 48 contacts 310.

FIG. 4 shows an exploded side view of a conventional IC testing system 350 employing interface structure 300 and a device tester 352 such as, for example, the Model TR-8 MDA tester. Computer 360, which may be, for example, a personal computer (PC), is connected to device tester 352 and includes well-known testing software residing in internal memory (e.g., system memory or a hard disk). BGA package 100 is mounted on socket 304 (for example, using a device handler) so that its solder balls 102 contact pogo pins 306 (not shown in FIG. 4) of socket 304. Interface structure 300 is mounted on docking area 356 of device tester 352 so that contacts 310 are aligned with and make electrical contact with corresponding test probes 354 of device tester 352. The testing software provides test and control signals to device tester 352 according to test parameters associated with BGA package 100. The test parameters may be stored in a file located in computer memory, or may be input into computer 360 using any suitable input device such as, for example, a keyboard (not shown).

Referring also to FIGS. 1A, 1B, and 3, device tester 352 provides the test signals through test probes 354 to contacts 310, along traces 312 to socket pogo pins 306, and finally to corresponding balls 102 of BGA package 100. For example, a test signal applied to contact 310a by a corresponding tester probe 354 of device tester 352 is routed along conductive trace 312a to pogo pin 306a, and thereafter to a corresponding ball 102 of BGA package 100. Signals are returned from BGA package 100 to device tester 352 in a similar manner.

A problem associated with conventional interface structure 300 is that socket 304 can support only one BGA package size and configuration (e.g., BGA package 100). Thus, if the physical dimensions of a package substrate do not match the size of socket 304, or if the number and placement of its solder balls do not match the arrangement of pogo pins 306, interface structure 300 cannot be used to test the package. For example, because BGA package 200 of FIGS. 2A and 2B has a peripheral footprint rather than a full footprint, and/or may have a different ball pitch than BGA package 100 of FIGS. 1A and 1B, interface structure 300 may not be suitable for testing BGA package 200. Accordingly, an IC manufacturer utilizing several BGA package sizes and configurations must purchase a separate interface structure for each BGA package size and configuration, thereby increasing device testing costs. In addition, switching between different interface structures mounted on a device tester undesirably increases testing time. Thus, there is a need for an interface structure that allows for testing BGA packages of different sizes and configurations.

SUMMARY

A method and apparatus are disclosed that allow a single interface structure to accommodate BGA packages of different sizes and configurations while preserving compatibility with an associated device tester. In accordance with one embodiment of the present invention, an interface structure includes first and second portions. The first portion has physical dimensions that are compatible with the docking area of the associated device tester, and includes a first socket configured to receive a first BGA package. The second portion, which is adjacent to and contiguous with the first portion, extends laterally beyond the docking area of the device tester to provide additional testing area that may include one or more additional sockets. In one embodiment, the second portion includes a second socket configured to receive a second BGA package, wherein the second size and configuration of second BGA package are different from the size and configuration of the first BGA package. Thus, the first socket has a plurality of pins for connecting to corresponding solder balls of the first BGA package, and the second socket has a plurality of pins for connecting to corresponding solder balls of the second BGA package. The first portion includes a plurality of conductive contacts formed in an arrangement that align with and contact corresponding test probes of the device tester. Each conductive contact in the first portion is electrically connected to a corresponding pin in the first socket by a corresponding first conductive trace, and electrically connected to a corresponding pin in the second socket by a corresponding second conductive trace.

Providing an additional test area to include the second socket advantageously allows first and second BGA packages having different sizes and/or configurations to be tested using the same interface board and device tester, thereby reducing testing costs and saving time. For example, the interface structure is mounted onto an associated device tester so that the first portion of the interface structure aligns with and mates to the docking area of the device tester, with the second portion extending beyond the docking area of the device tester. During a first test procedure, a first BGA package is mounted on the first socket of the interface structure, and test signals associated with the first BGA package are transmitted between the device tester and the first BGA package to test the first BGA package. The first BGA package is then removed from the first socket. During a second test procedure, a second BGA package is mounted on the second socket of the interface structure. Test signals associated with the second BGA package are transmitted between the device tester and the second BGA package to test the second BGA package.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Embodiments of the present invention are discussed below in the context of an interface structure that is compatible with the Model TR-8 MDA tester from Checksum, Inc. Discussion of this one interface structure is for simplicity only. It is to be understood that embodiments of the present invention are equally applicable to interface structures compatible with other device testers available from other manufacturers. Further, as used herein, the term "BGA" refers to any IC product or package having solder balls for connecting to an external circuit or system. In addition, the term "package size" is used to describe the peripheral size and shape of a BGA package substrate, and the term "configuration" is used to described the spacing and arrangement of solder balls on a BGA package substrate. Accordingly, the present invention is not to be construed as being limited to specific examples described herein but rather includes within its scope all embodiments defined by the appended claims.

Figure 3:
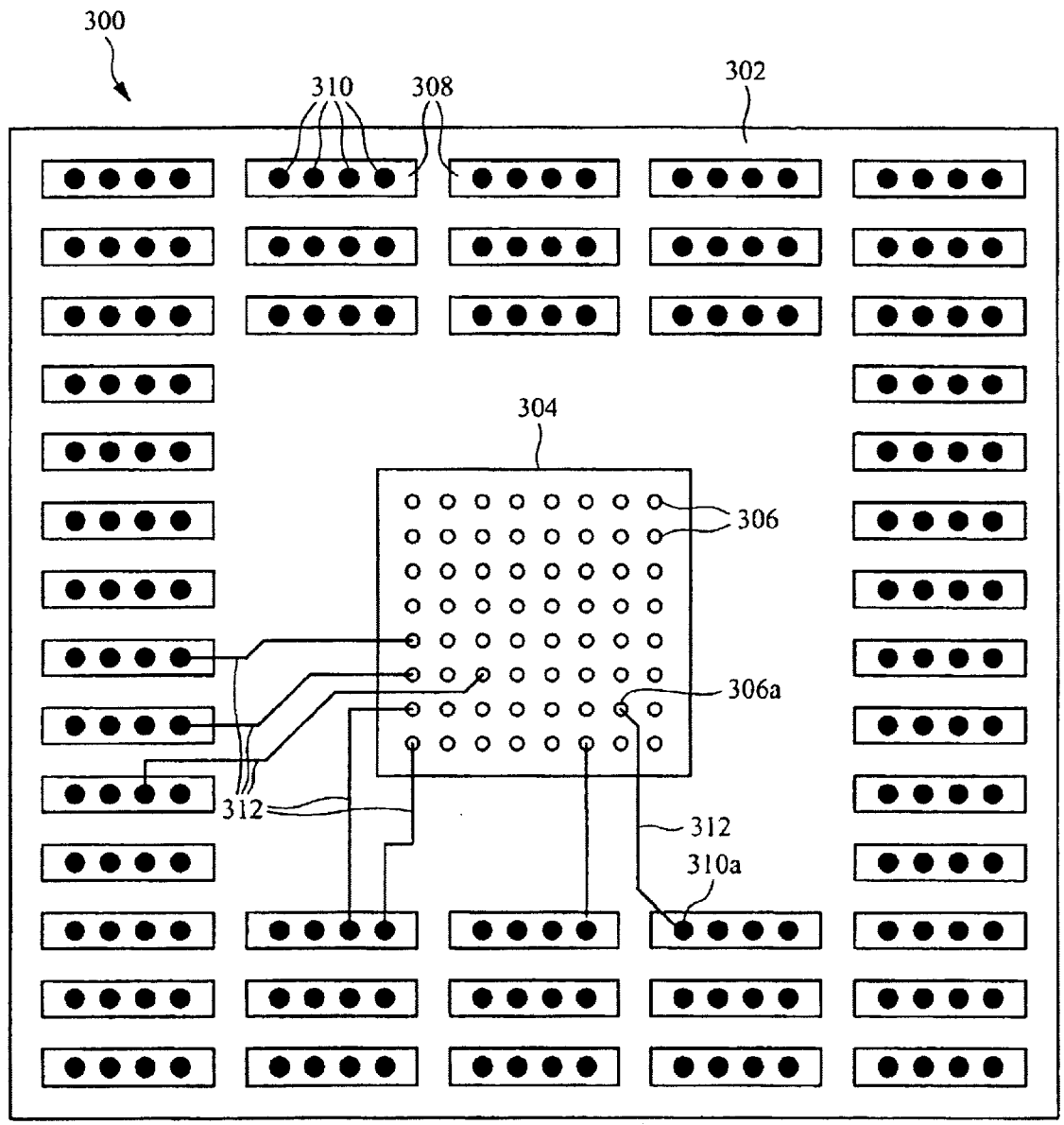
FIG. 3 is a top view of a conventional interface structure.
Figure 4:
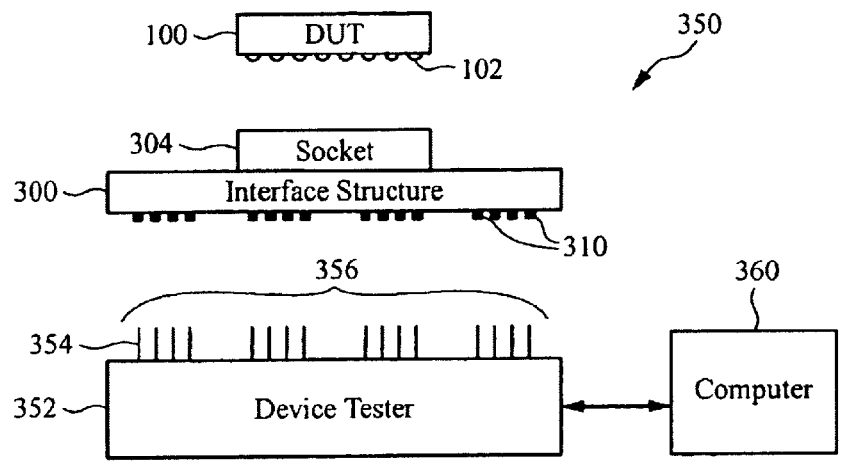
FIG. 4 is an exploded side view of a conventional IC testing system including a device tester and the conventional interface structure of FIG. 3.
Figure 5:
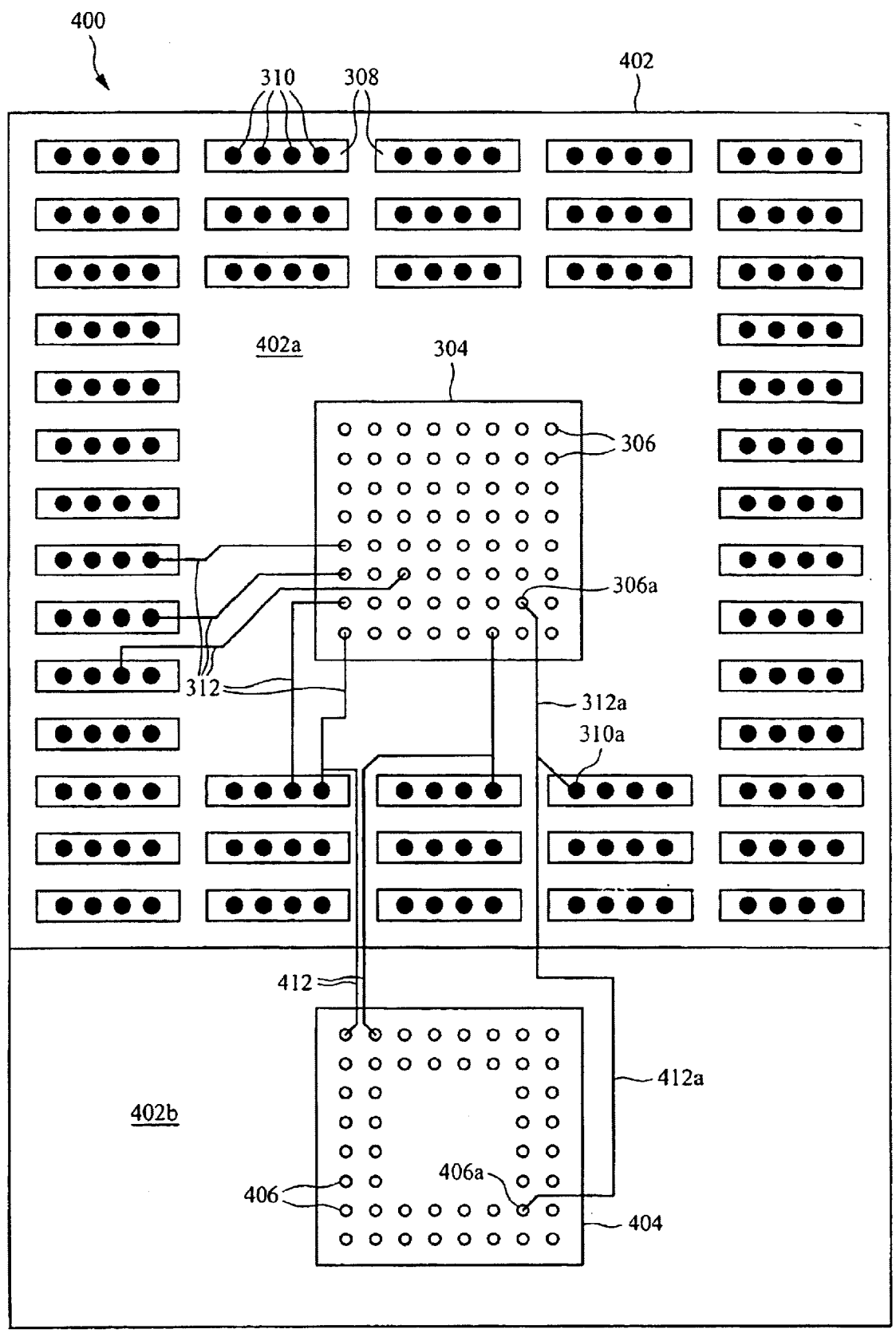
FIG. 5 is a top view of an interface structure in accordance with one embodiment of the present invention.

FIG. 5 shows an interface structure 400 in accordance with one embodiment of the present invention that may be used to test BGA packages having different package sizes and/or configurations using the same device tester. Interface structure 400 includes a printed circuit board (PCB) 402 having a first portion 402a and a second portion 402b. First portion 402a is similar to conventional interface structure 300 of FIG. 3, and is of a size and shape that provides compatibility with the docking area of an associated device tester. For example, referring also to FIG. 6, first portion 402a aligns with and mounts onto docking area 356 of device tester 352 so that contacts 310 included within first portion 402a align with and make electrical contact with corresponding test probes 354 of device tester 352. Thus, the first portion 402a includes an outer peripheral boundary that fits within docking area 356 of device tester 352. For simplicity, each contact group 308 is shown to include 4 contacts 310 to contact corresponding test probes 354 of device tester 352. For actual embodiments, contact groups 308 may include any suitable number of contacts 310 to mate with corresponding test probes of device tester 352. For one embodiment, each contact group 308 includes 48 contacts 310 and is compatible with the Model TR-8 MDA tester from Checksum, Inc. For other embodiments, contact groups 308 of first portion 402a of interface structure 400 may be arranged to align with test probes of other device testers.

Figure 1A:
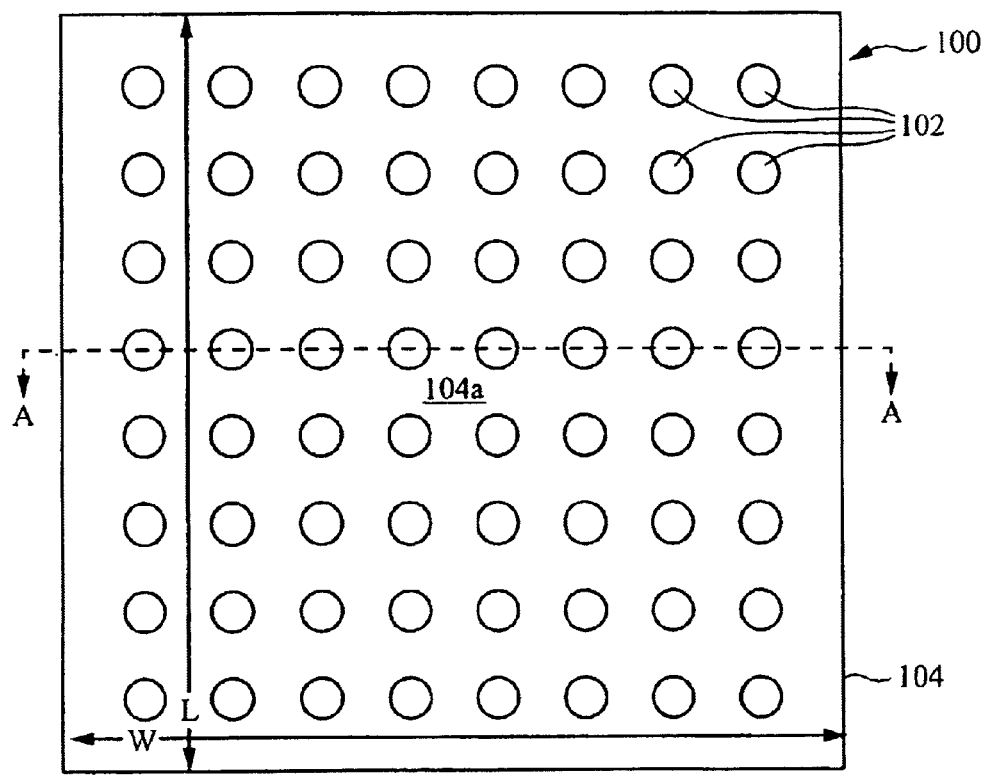
FIG. 1A is a bottom view of a conventional BGA package having a full footprint.
Figure 1B:
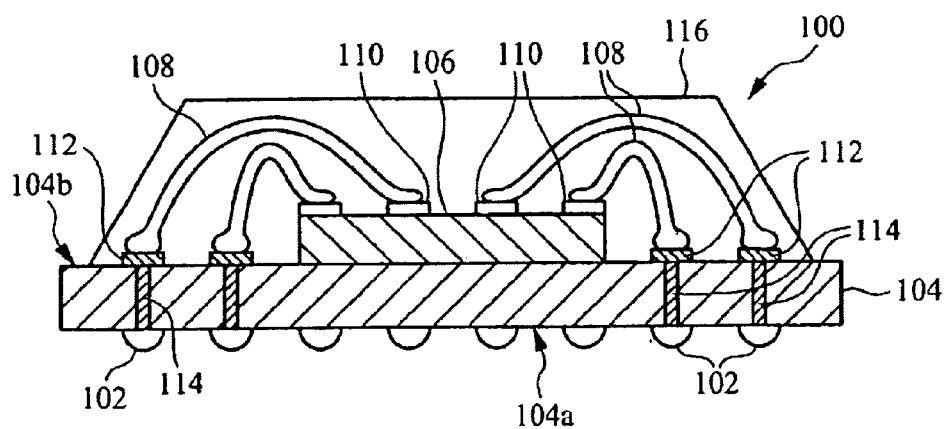
FIG. 1B is a sectional side view of the BGA package of FIG. 1A taken along line AA.

First portion 402a includes first socket 304 having a plurality of first compressible pins such as pogo pins 306 arranged in a matrix so as to mate with and contact corresponding solder balls of a first BGA package such as, for example, BGA package 100 of FIGS. 1A and 1B. Each pin 306 in first socket 304 is connected to a corresponding contact 310 formed in first portion 402a by a corresponding conductive trace 312.

Figure 2A:
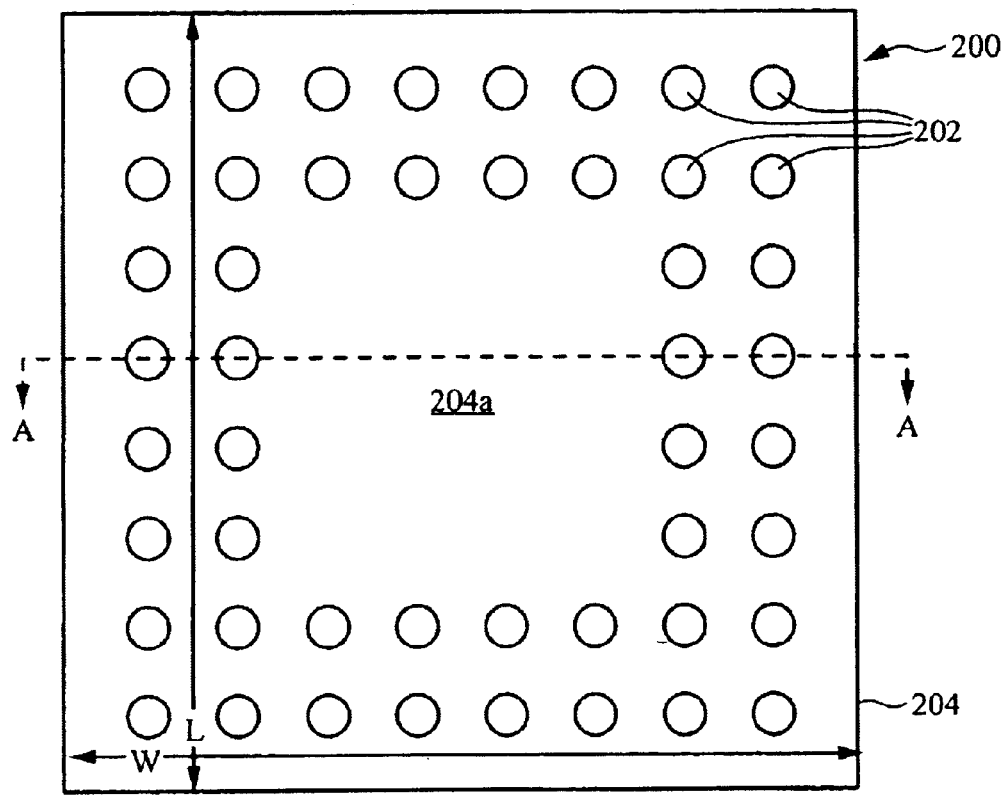
FIG. 2A is a bottom view of a conventional BGA package having a peripheral footprint.
Figure 2B:
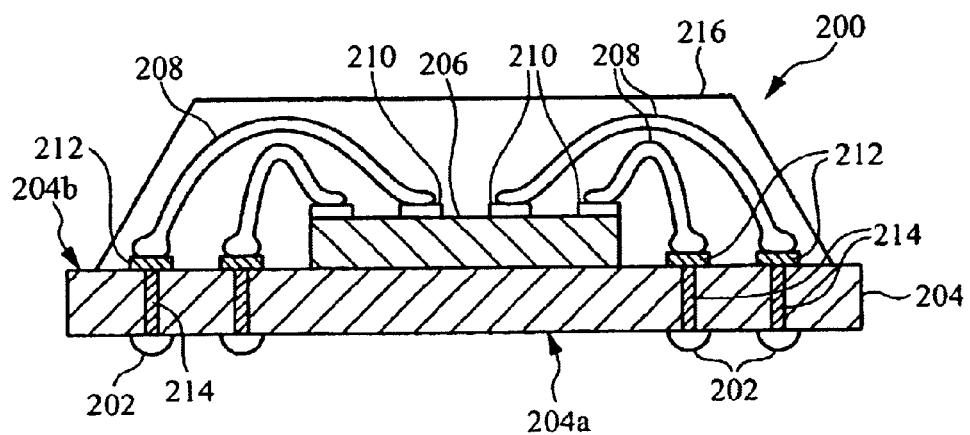
FIG. 2B is a sectional side view of the BGA package of FIG. 2A taken along line AA.
Figure 6:
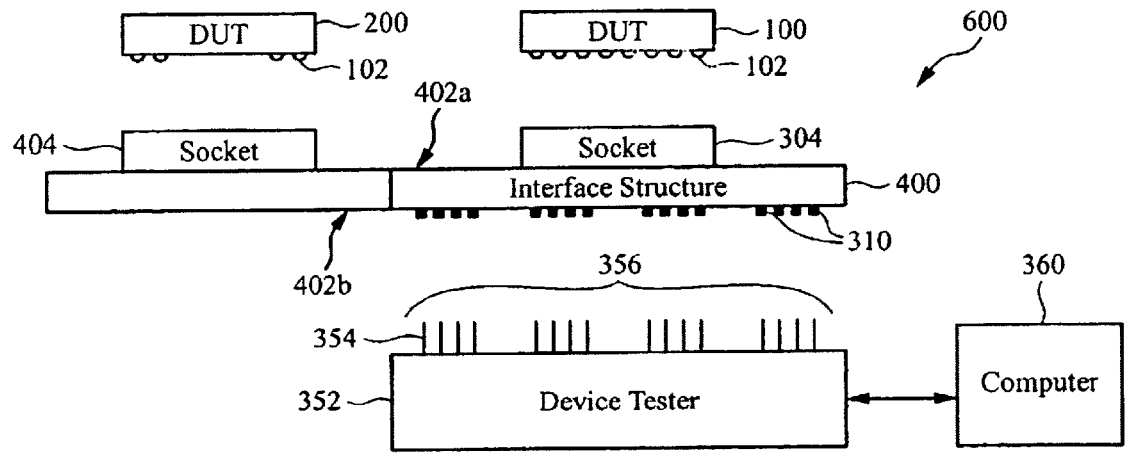
FIG. 6 is an exploded side view of an IC testing system including a device tester and the interface structure of FIG. 5.

Second portion 402b is adjacent to and contiguous with first portion 402a, and extends laterally beyond docking area 356 of device tester 352 to provide additional testing area, as illustrated in FIG. 6. Thus, second portion 402b includes an outer peripheral boundary that is entirely outside docking area 356 of device tester 352. Second portion 402b includes a second socket 404 having a plurality of second compressible pins such as pogo pins 406 arranged in a matrix so as to mate with and contact corresponding solder balls of a second BGA package such as, for example, BGA package 200 of FIGS. 2A and 2B, where the size and/or configuration of the second BGA package may be different from that of the first BGA package. Thus, the number and arrangement of first socket pins 306 may be different from the number and arrangement of second socket pins 406. Each pin 406 in second socket 404 is connected to a corresponding contact 310 formed in first portion 402a by a corresponding conductive trace 412. For simplicity, only a few conductive traces 412 are shown in FIG. 5.

For one embodiment, the second conductive traces 412 formed in second portion 402b extend into first portion 402a and connect to corresponding first traces 312 formed in first portion 402a. For example, pogo pin 406a of second socket 404 is connected to second conductive trace 412a, which in turn is connected to corresponding contact 310a via first conductive trace 312a. For other embodiments, second conductive traces 412 may be connected directly to corresponding contacts 310 in first portion 402a. In this manner, each contact 310 of interface structure 400 is connected to a corresponding pin 306 in first socket 304 and to a corresponding pin 406 in second socket 404.

First and second sockets 304 and 404 may be any well-known IC device test socket. For one embodiment, sockets 304 and 404 are of the type described in commonly owned U.S. Pat. No. 5,955,888, incorporated by reference herein. For another embodiment, sockets 304 and 404 are of the type described by Hornchek and Mardi in co-pending and commonly owned U.S. patent application Ser. No. 09/849,815 entitled "Interface Apparatus and Method for Testing Different Sized Ball Grid Array Integrated Circuits," incorporated by reference herein.

As mentioned above, first and second sockets 304 and 404 may be any suitable size and may include any number of pogo pins positioned in any suitable arrangement to receive BGA packages of various sizes and configurations. Thus, although first socket 304 is shown in FIG. 5 as having 64 pins arranged to receive BGA package having a full footprint, in other embodiments first socket 304 may include a different number of pins having other arrangements, for example, to receive a BGA package having a peripheral footprint. Similarly, although second socket 404 is shown in FIG. 5 as having 48 pins arranged to receive a BGA package having a peripheral footprint, in other embodiments second socket 404 may include a different number of pins having other arrangements, for example, to receive a BGA package having a full footprint. Further, the respective pin pitches of first socket 304 and second socket 404 may vary as desired to provide compatibility with different BGA packages to be tested.

For one embodiment, first socket 304 includes a full matrix of 2048 pins 306 having a pitch of 1 mm to receive a compatible 45 mm×45 mm BGA package, and second socket 404 includes a peripheral matrix of 560 pins 406 having a 1.27 mm pitch to receive a compatible 42.5 mm×42.5 mm BGA package. For another embodiment, second socket 404 includes a peripheral matrix of 352 pins 406 having a 1.27 mm pitch to receive a compatible 35 mm×35 mm BGA package.

Figure 7:
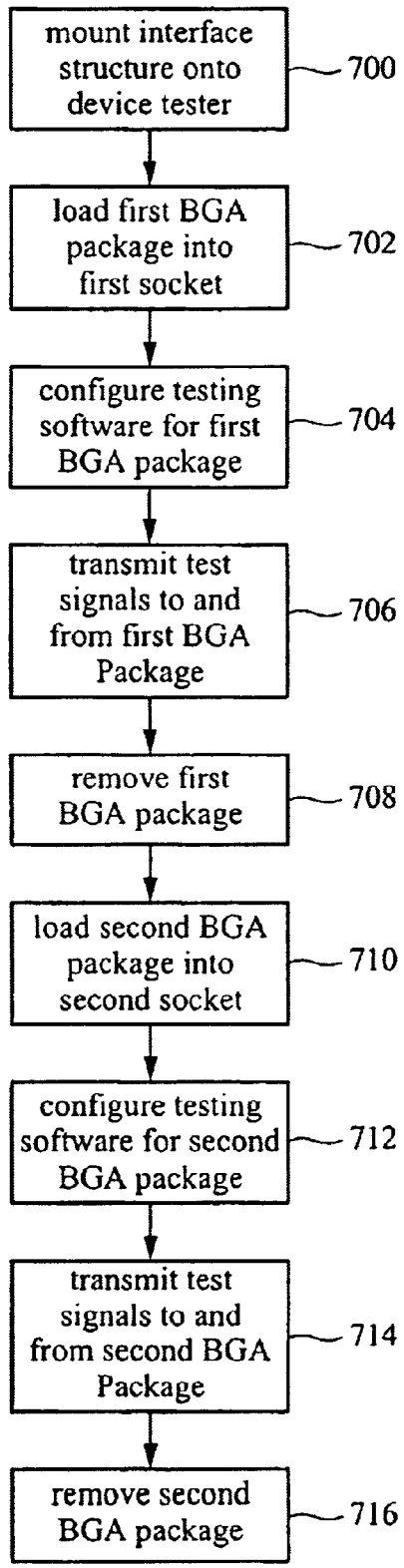
FIG. 7 is a flow chart illustrating one embodiment of an exemplary test operation of first and second BGA packages using the interface structure of FIG. 5.

Referring to the flow chart of FIG. 7, interface structure 400 is prepared for testing various BGA packages as follows, with reference also being made to FIGS. 1A, 1B, 2A, 2B, 5, and 6. Interface structure 400 is mounted onto device tester 352 so that first portion 402a is aligned over docking area 356 and test probes 354 are connected to corresponding contacts 310 of first portion 402a, as shown in FIG. 6 (step 700). A device handler (not shown) positions a first BGA package (e.g., BGA package 100) into first socket 304 of interface structure 400 so that pogo pins 306 of first socket 304 contact corresponding solder balls of the first BGA package (step 702). Well-known testing software executing on computer 360 loads testing parameters associated with the first BGA package, and transmits appropriate test and control signals to device tester 352 in a well-known manner (step 704). Device tester 352 then transmits test signals to and from the first BGA package (step 706). For example, test signals provided by device tester 352 are provided to contacts 310 in first portion 402a via corresponding test probes 354 and thereafter transmitted to corresponding solder balls of the first BGA package via conductive traces 312 and first socket pogo pins 306. Upon completion of the test signal transmission, the device handler removes the first BGA package from first socket 304 (step 708).

Then, the device handler positions the second BGA package (e.g., BGA package 200) into second socket 404 of interface structure 400 so that pogo pins 406 of second socket 404 contact corresponding solder balls of the second BGA package (step 710). The testing software executing on computer 360 loads testing parameters associated with the second BGA package, and transmits appropriate test and control signals to device tester 352 in a well-known manner (step 712). Device tester 352 then transmits test signals to and from the second BGA package (step 714). For example, test signals provided by device tester 352 are provided to contacts 310 in first portion 402a via corresponding test probes 354 and thereafter transmitted to corresponding solder balls of the second BGA package via conductive traces 312 and 412 and second socket pogo pins 406. Upon completion of the test signal transmission, the device handler removes the second BGA package from second socket 404 (step 716).

Because contacts 310 of interface structure 400 are connected to both first socket pins 306 via first conductive traces 312 and to second socket pins 406 via second conductive traces 412, test signals provided to interface structure 400 by device tester 352 are automatically routed to both sockets 304 and 404, thereby eliminating the need for any switching circuitry between contacts 310 and sockets 304 and 404. Accordingly, only one of sockets 304 and 404 should receive a corresponding BGA package for testing at any given time. For other embodiments, interface structure 400 may include switching circuitry to selectively route test signals from contacts 310 to either first socket 304 or second socket 404.

Figure 8:
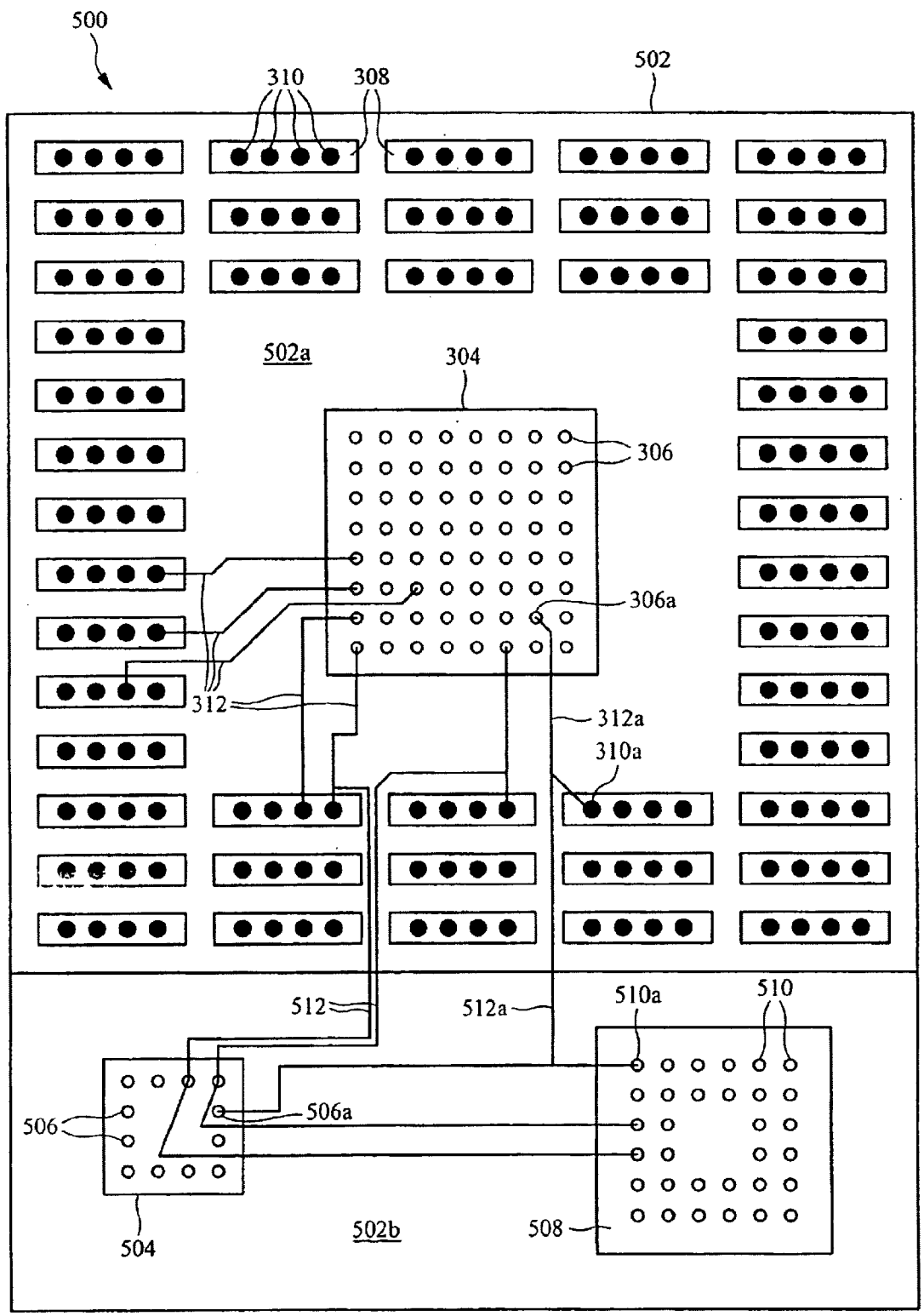
FIG. 8 is a top view of an interface structure in accordance with another embodiment of the present invention.

Interface structures in accordance with the present invention may include more than one test socket in the additional test area provided by second portion 402b. For example, FIG. 8 shows an interface structure 500 that includes a first portion 502a having a first socket 304, and a second portion 502b having a second socket 504 and a third socket 508. First socket 304 includes a plurality of first compressible pins such as pogo pins 306 arranged in a matrix so as to mate with and contact corresponding solder balls of a first BGA package such as, for example, BGA package 100, as described above with respect to FIG. 5.

Second socket 504 includes a plurality of second compressible pins such as pogo pins 506 arranged in a matrix so as to mate with and contact corresponding solder balls of a second BGA package (not shown) having a size and/or configuration different from that of the first BGA package (not shown). Each pin 506 in second socket 504 is connected to a corresponding contact 310 formed in first portion 502a by a corresponding second conductive trace 512. For example, pin 506a of second socket 504 is connected to contact 310a by second conductive trace 512a and first conductive trace 312a. For simplicity, only a few conductive traces 512 are shown in FIG. 8.

Third socket 508 includes a plurality of third compressible pins such as pogo pins 510 arranged in a matrix so as to mate with and contact corresponding solder balls of a third BGA package (not shown) having a size and/or configuration different than that of the first and second BGA packages (not shown). Each pin 510 in third socket 508 is connected to a corresponding contact 310 formed in first portion 502a by a corresponding conductive trace 512.

For one embodiment, the second conductive traces 512 formed in second portion 502b extend into first portion 502a and connect to corresponding first traces 312 formed in first portion 502a. For example, pogo pin 506a of second socket 504 and pogo pin 510a of third socket 508 are connected to second conductive trace 512a, which in turn is connected to corresponding contact 310a via first conductive trace 312a. For other embodiments, second conductive traces 512 may be connected directly to corresponding contacts 310 in first portion 502a. In this manner, each contact 310 of interface structure 500 is connected to a corresponding pin 306 in first socket 304, to a corresponding pin 506 in second socket 504, and to a corresponding pin 510 in third socket 508.

In yet another embodiment, more than one additional test area such as 502b is provided, and thus accommodates more different types of sockets to allow testing of more types of devices without removing an interface structure.

Sockets 304, 504, and 508 of interface structure 500 may be any suitable size and may include any number of pogo pins positioned in any suitable arrangement to receive BGA packages of various sizes and configurations. For one embodiment, first socket 304 includes a full matrix of 2048 pins 306 having a pitch of 1 mm to receive a compatible 45 mm×45 mm BGA package, second socket 504 includes a peripheral matrix of 560 pins 406 having a 1.27 mm pitch to receive a compatible 42.5 mm×42.5 mm BGA package, and third socket 508 includes a peripheral matrix of 352 pins 406 having a 1.27 mm pitch to receive a compatible 35 mm×35 mm BGA package.

What is claimed is:

1. An interface structure for routing test signals between various packaged integrated circuits and a device tester having a docking area including a plurality of test probes, comprising:
   a first portion adapted to align with and mount on the docking area of the device tester, the first portion having an outer peripheral boundary that fits within the docking area of the device tester and comprising:
      a first socket for receiving a first packaged integrated circuit, the first socket having a plurality of pins for connecting to the first packaged integrated circuit;
      a plurality of contacts formed in a predetermined arrangement to contact corresponding test probes of the device tester; and
      a plurality of first conductive traces, each connected between a corresponding contact and a corresponding pin of the first socket; and
   a second portion extending laterally beyond the first portion to provide an additional testing area, the second portion having an outer peripheral boundary positioned beyond the docking area of the device tester and comprising:
      a second socket for receiving a second packaged integrated circuit, the second socket having a plurality of pins for connecting to the second packaged integrated circuit; and
      a plurality of second conductive traces, each extending into the first portion and connected between a corresponding contact and a corresponding pin of the second socket.

2. The interface structure of claim 1, wherein the pins of the first and second sockets comprise compressible pogo pins.

3. The interface structure of claim 1, wherein the pins of the first socket are positioned in a first configuration, and the second socket pins are positioned in a second configuration different from the first configuration.

4. The interface structure of claim 3, wherein the pins of the first socket are compatible with a BGA package having a full footprint, and the pins of the second socket are compatible with a BGA package having a peripheral footprint.

5. The interface structure of claim 1, wherein each contact is connected to a corresponding first socket pin and a corresponding second socket pin without any switching circuitry.

6. An integrated circuit testing system, comprising:
   a device tester having a docking area including a plurality of test probes; and
   an interface structure for routing test signals between the device tester and a first or second packaged integrated circuit, comprising:
      a first portion having an outer peripheral boundary that fits within the docking area of the device tester, the first portion including a first socket for receiving the first packaged integrated circuit, a plurality of contacts formed in a predetermined arrangement to contact corresponding test probes of the device tester, and a plurality of first conductive traces connected between corresponding contacts and the first socket; and
      a second portion adjacent to and contiguous with the first portion and having an outer peripheral boundary that is at least partly outside the docking area of the device tester, the second portion including a second socket for receiving the second packaged integrated circuit, and a plurality of second conductive traces extending into the first portion and connected between corresponding contacts and the second socket.

7. The system of claim 6, wherein the first socket includes a plurality of pins to connect with corresponding leads of the first packaged integrated circuit, and the second socket includes a plurality of pins to connect with corresponding leads of the second packaged integrated circuit.

8. The system of claim 7, wherein the pins of the first socket are positioned in a first configuration, and the pins of the second socket are positioned in a second configuration different from the first configuration.

9. The interface structure of claim 6, wherein the pins of the first and second sockets comprise compressible pogo pins.

10. The interface structure of claim 6, wherein each contact is connected to corresponding pins in the first socket and the second socket without any switching circuitry.

11. A method for testing a first or second packaged integrated circuit, comprising:

mounting an interface structure having first and second portions onto a docking area of a device tester, wherein the first portion has an outer peripheral boundary that fits within the docking area of the device tester and includes a first socket configured to receive the first packaged integrated circuit, and the second portion has an outer peripheral boundary that is outside the docking area of the device tester and includes a second socket configured to receive the second packaged integrated circuit;

inserting the first packaged integrated circuit into the first socket;

transmitting test signals associated with the first packaged integrated circuit from the device tester to the first and second sockets; and receiving test signals from the first packaged integrated circuit into the device tester.

12. The method of claim 11, further comprising:

removing the first packaged integrated circuit from the first socket;

inserting the second packaged integrated circuit into the second socket;

transmitting test signals associated with the second packaged integrated circuit from the device tester to the first and second sockets; and receiving test signals from the second packaged integrated circuit into the device tester.

* * * * *